United States Patent [19]
Uchida et al.

[11] Patent Number: 5,408,487
[45] Date of Patent: Apr. 18, 1995

[54] SEMICONDUCTOR LASER

[75] Inventors: Toru Uchida; Chikashi Anayama; Susumu Yamazaki; Hirohide Kurakake; Akito Kuramata; Haruhisa Soda, all of Kawasaki, Japan

[73] Assignee: Fujitsu Limited, Kanagawa, Japan

[21] Appl. No.: 214,212

[22] Filed: Mar. 17, 1994

[30] Foreign Application Priority Data

Mar. 18, 1993 [JP] Japan ................................. 5-057629
Dec. 20, 1993 [JP] Japan ................................. 5-319711

[51] Int. Cl.$^6$ ................................................ H01S 3/19
[52] U.S. Cl. ..................................... 372/45; 372/46
[58] Field of Search ............................ 372/45, 46, 43

[56] References Cited

U.S. PATENT DOCUMENTS

| | | | |
|---|---|---|---|
| 5,153,889 | 10/1992 | Sugawara et al. | 372/45 |
| 5,189,679 | 2/1993 | Derry et al. | 372/45 |
| 5,218,613 | 6/1993 | Serreze | 372/45 |
| 5,235,194 | 8/1993 | Izumiya et al. | 372/45 |
| 5,257,276 | 10/1993 | Forouhar et al. | 372/45 |

FOREIGN PATENT DOCUMENTS 0457571 1/1992 European Pat. Off. .

OTHER PUBLICATIONS

Patent Abstracts of Japan, vol. 9, No. 19, Jan. 1985 JP59165484.

Patent Abstracts of Japan, vol. 15, No. 343, Aug. 1991 JP3131081.

Japanese Journal of Applied Physics, May 1992, Kasukawa et al., 31:1365-1371 *1.5 μm GaInAs/AlGaInAs Graded-Index Separate-Confinement-Heterostructure Quantum Well Laser Diodes Grown by Organometallic Chemical Vapor Deposition*.

Applied Physics Letter, Oct.1989, Melman et al., 55:1436-1438 *InGaAs/GaAs strained quantum wells with a 1.3 mum band edge at room temperature*.

Applied Physics Letter, Nov. 1991, Roan et al., 59:2688-2690 *Long wavelength 1.3 mum luminescence in INGAAs strained well structures grown on GaAs*.

*Primary Examiner*—Georgia Epps
*Attorney, Agent, or Firm*—Armstrong, Westerman, Hattori, McLeland & Naughton

[57] ABSTRACT

A group III-V compound semiconductor laser of a 1 μm band having an excellent conversion efficiency and a high characteristic temperature. The semiconductor laser can emit light in a 1.3 μm band or a 1.55 μm, and has a laser structure including an active layer For emitting light, guide layers sandwiching the active layer and having a band gap larger than the active layer, and clad layers embracing the guide layers and having a band gap larger than the guide layers. The lattice constants of the guide layers and clad layers are larger than a1 by 0.5% or more and smaller than a2 by 0.5% or more, where a1 represents the lattice constant of GaAs and a2 is the lattice constant of InP.

34 Claims, 14 Drawing Sheets

| | |
|---|---|
| p-$In_{0.2}Ga_{0.8}As$ | 8 |
| p-$In_{0.7}Ga_{0.3}P$ | 7b |
| $In_{0.2}Ga_{0.8}As$ | 6 |
| $In_{0.4}Ga_{0.6}As$ | 5 |
| $In_{0.2}Ga_{0.8}As$ | 6 |
| n-$In_{0.7}Ga_{0.3}P$ | 7a |
| n-$In_{0.2}Ga_{0.8}As$ | 2 |
| n-GaAs | 1 |

CARRIER CONCENTRATION OF n-InGaP CLAD LAYER DOPED WITH Se (cm$^{-3}$)

SEMICONDUCTOR LASER

BACKGROUND OF THE INVENTION a) Field of the Invention

The present invention relates to a semiconductor laser, and more particularly to a semiconductor laser having an excellent conversion efficiency.

b) Description of the Related Art

Optical fiber communications have spread from large capacity trunk systems to subscriber systems. Low cost systems are essential for subscriber optical fiber communications. As a light source, a Peltier-free system which requires no cooler is desired.

From this viewpoint, a semiconductor laser has long been desired which can emit a sufficiently large light output at a low drive current even at a high temperature of near 85° C. It is therefore necessary to raise a characteristic temperature of a semiconductor laser sufficiently high because the characteristic temperature governs the temperature characteristics of the semiconductor laser.

Semiconductor lasers have been fabricated heretofore on a GaAs substrate or an InP substrate. Semiconductor lasers for optical fiber communications are required to have an emitted light wavelength of a 1.3 $\mu$m band or 1.55 $\mu$m band (collectively called 1 $\mu$m band) at which an optical fiber has less loss.

Light emission of the 1 $\mu$m band cannot be obtained by a semiconductor laser which uses an epitaxial layer lattice-matching and formed on a GaAs substrate. InP substrates have been used therefore for semiconductor lasers of the 1 $\mu$m band.

A typical semiconductor laser of the 1 $\mu$m band uses InGaAsP/InP based materials utilizing an InP substrate and InGaAsP active layer. It is desired to form a clad layer having a wide band gap in order to confine carries in and near an active layer. InP has been used because this material has the widest band gap among group III-V compound semiconductors which lattice-match an InP substrate.

A guide layer (light waveguide layer, barrier layer) For confining light in and near the active layer is interposed between the clad layer and active layer. As the guide layer, InGaAsP having a wider band gap than the active layer has been used.

However, a characteristic temperature of such an InGaAsP/InP semiconductor laser is about 60 K and steeply lowers its light output at a high temperature.

Depending on materials having relatively narrow and wide band gaps used to form a potential barrier between the active layer and barrier layer, a ratio ($\Delta Ec/\Delta Ev$) of a band discontinuity ($\Delta Ec$) between conduction bands to a band discontinuity ($\Delta Ev$) between valence bands changes.

The effective mass of an electron is lighter than a hole. It is therefore desired that $\Delta Ec$ is larger than $\Delta Ev$ so as to efficiently confine electrons arid holes in the active layer. However, if lattice-matched layers having different band gaps are formed by InGaAsP/InP based materials, $\Delta Ev$ becomes considerably larger than $\Delta Ec$.

Semiconductor lasers with an improved performance at a high temperature have been developed by forming a clad layer and guide layer with AlInGaAs based materials. By using AlInGaAs based materials, $\Delta Ec$ can be made large and the temperature characteristics can be improved to some degree.

However, the characteristic temperature obtained by using AlInGaAs based materials is not still satisfactory. In order to make the characteristic temperature sufficiently high, it is desired to make the value of $\Delta Ec$ larger than the value of $\Delta Ev$ by the degree corresponding to the difference between the hole effective mass and hole effective mass.

It is known that a lasting threshold current of a semiconductor laser lowers if an active layer with strains is used. There is also known a strain MQW (multi quantum well) semiconductor laser using a strain active layer of a superlattice structure. The temperature dependency of a strain MQW semiconductor laser has not been improved as yet.

It has been proposed to make opposite reflection surfaces of a cavity of a semiconductor laser have a high reflectance so as to realize a low oscillation threshold value even at a high temperature. Since the intensity of light reciprocally moving in the cavity increases, a drive current can be reduced. However, a high reflectance cavity lowers a light output.

With conventional techniques described above, it has been difficult to realize semiconductor lasers of the 1 $\mu$m band having a high characteristic temperature.

SUMMARY OF THE INVENTION

It is an object of the present invention to provide a semiconductor laser of the 1 $\mu$m band capable of realizing a high characteristic temperature.

It is another object of the present invention to provide a semiconductor laser having a high light conversion efficiency.

According to one aspect of the present invention, there is provided a group III-V compound semiconductor laser For emitting light in a 1.3 $\mu$m band or a 1.55 $\mu$m, the semiconductor laser having a laser structure including an active layer for emitting light, guide layers sandwiching the active layer and having a band gap larger than the active layer, and clad layers 7 embracing the guide layers and having a band gap larger than the guide layers, wherein the lattice constants of the guide layers and clad layers are larger than a1 by 0.5% or more and smaller than a2 by 0.5% or more, where a1 represents the lattice constant of GaAs and a2 represents the lattice constant off InP.

Only an InP substrate can be used if a 1 $\mu$m band semiconductor laser is formed by using presently available group III-V compound semiconductors.

However, in the case of a 1 $\mu$m band semiconductor laser using an InP substrate and group III-V compound semiconductors lattice-matching InP, it has been difficult to form band discontinuities which can provide a good effect of confining both electrons at the conduction band and holes at the valence band, between the active layer and guide layer.

If a crystalline layer having a lattice constant between the lattice constants of GaAs and InP is used, the kind of usable group III-V compound semiconductor materials becomes wide ensuring better band discontinuities.

For the laser structure in which an active layer is interposed between guide layers and clad layers embrace the guide layers, it is necessary to lattice-match the guide and clad layers with the underlying crystalline layers.

By setting the lattice constant of InP smaller than the lattice constant of the underlying crystalline layers, it becomes possible to select materials of the guide layers and active layer which materials allow to form more preferable band discontinuities.

As explained above, it is possible to provide a group III-V compound semiconductor laser of the 1 μm band having excellent temperature characteristics.

It is also possible to provide a group III-V compound semiconductor laser of the 1 μm band having an excellent light emission efficiency.

DETAILED DESCRIPTION OF THE PREFERRED EMBODIMENTS

Figures 1A, 1B:
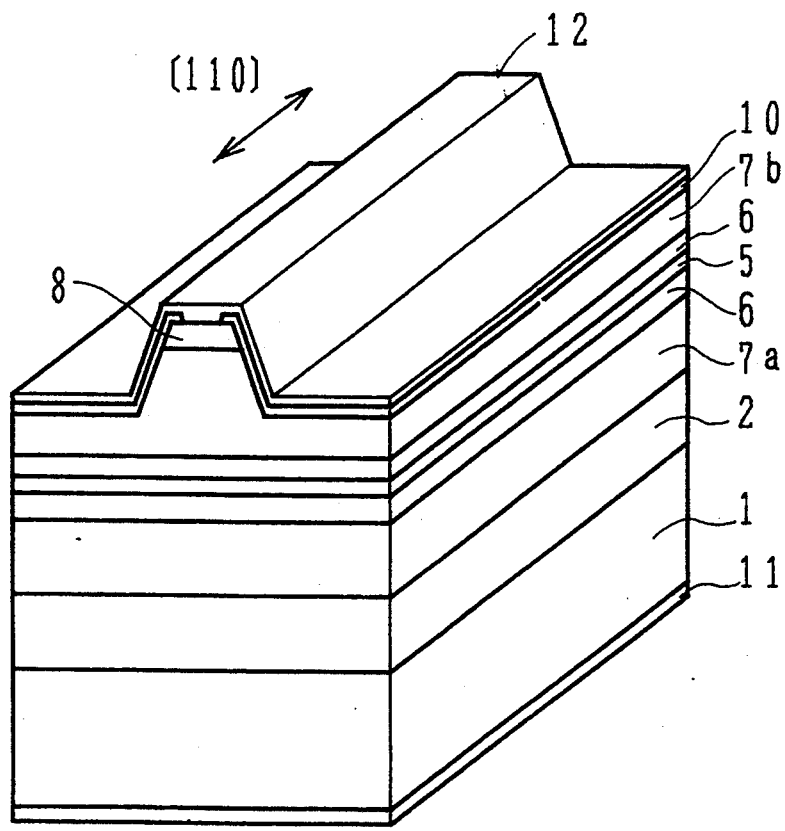
FIGS. 1A and 1B are a perspective view and a schematic cross sectional view of a semiconductor laser according to an embodiment of the present invention.

FIGS. 1A and 1B show the structure of a semiconductor laser according to an embodiment of this invention. FIG. 1A is a perspective view of the semiconductor laser and FIG. 1B is a schematic diagram illustrating the structure of semiconductor layers.

An n-type GaAs substrate 1 is formed thereon with an n-type $IN_{0.2}Ga_{0.8}As$ strain buffer layer 2. The substrate 1 and strain buffer layer 2 are underlying crystalline layers. The strain buffer layer 2 has a larger lattice constant than the GaAs substrate 1. The strain buffer layer 2 is grown to a thickness sufficient for obtaining a larger in-plane lattice constant than GaAs. That is, the uppermost surface of the underlying crystalline layers 1 and 2 has a lattice constant larger than GaAs and smaller than InP.

A laser structure is epitaxially grown on the underlying crystalline layers. The laser structure is formed by an active layer 5 of undoped $In_{0.4}Ga_{0.6}As$, guide layers 6 of undoped $In_{0.2}Ga_{0.8}As$ sandwiching the active layer 5, and clad layers 7 of $In_{0.7}Ga_{0.3}P$ embracing the guide layers 6. The lower clad layer 7a is doped to be an n-type, and the upper clad layer 7b is doped to be a p-type.

On this laser structure, a contact layer 8 of p-type $In_{0.2}Ga_{0.8}As$ is epitaxially formed.

As shown in FIG. 1A, part of the contact layer 8 and p-type clad layer 7b is etched in a stripe shape to form a normal mesa type which gradually narrows the width in the upward direction.

An insulating layer 10 of $SiO_2$ or the like is formed on the upper surface of the laser, exposing generally the whole top surface of the mesa structure. A p-side electrode 12 made of a laminated layer of a Ti layer, a Pt layer, and an Au layer is formed over the insulating layer 10. An n-side electrode made of an AuGe Layer or Au layer is formed on the bottom surface of the substrate 1.

The in-plane lattice constant of the strain buffer layer 2 is set larger than that of GaAs by 0.5% or more and smaller than that of InP by 0.5% or more. By setting the lattice constant to such a value, the effects not obtained by an InP substrate or GaAs substrate alone become likely to be obtained. Use of the lattice constant smaller than that of InP by 0.5% or more ensures the merit of using a small lattice constant. However, if the lattice constant is not larger than that of GaAs by 0.5% or more, it is difficult to realize a 1 μm band semiconductor laser.

Data and experiment results the embodiment relied on will be explained.

Figure 3A:
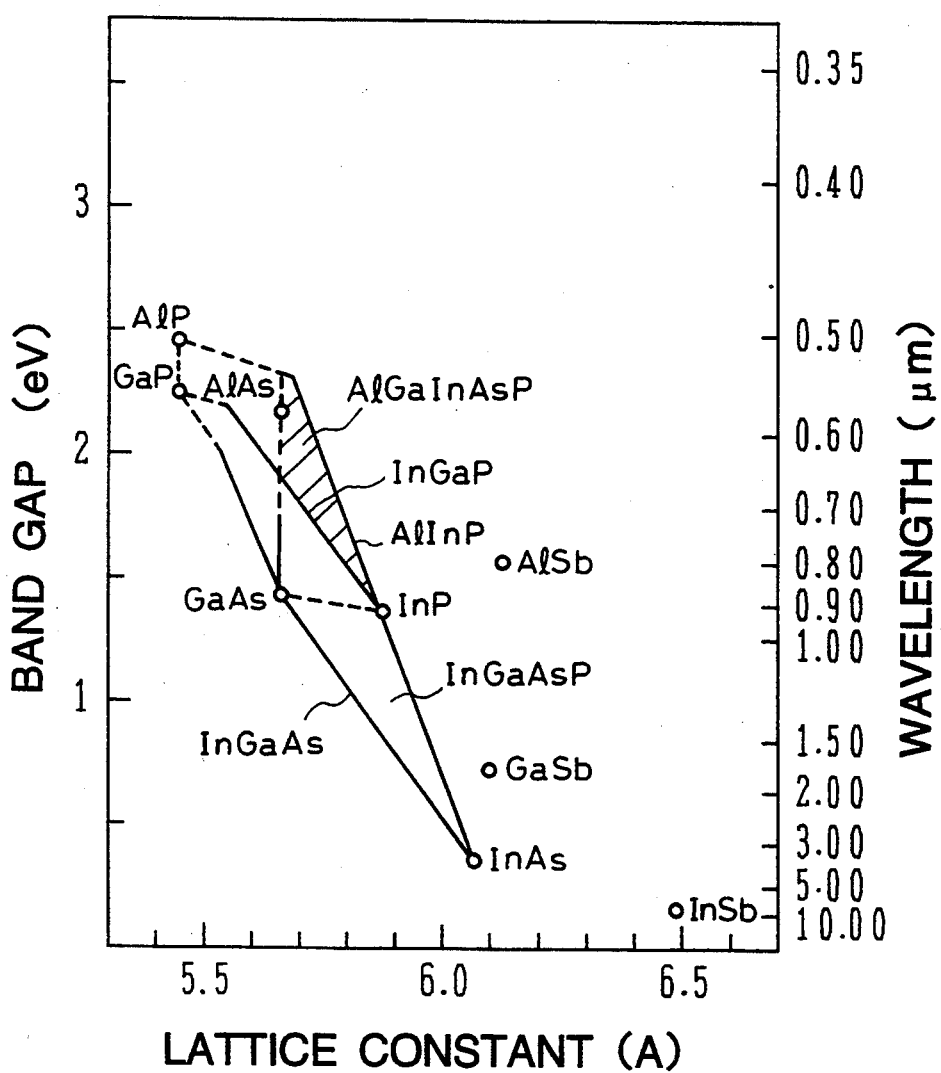
FIGS. 3A, 3B, and 3C are a graph explaining a group III-V compound semiconductor laser and diagrams showing band structures.

FIG. 3A is a graph showing the relationship between a band gap and a lattice constant of group III-V compound semiconductor semiconductors. The abscissa represents a lattice constant in A and the ordinate represents a band gap in eV.

GaAs and InP are most typical materials used for the substrate of a group III-V compound semiconductor laser. GaAs has a band gap slightly wider than InP, and InP has a lattice constant larger than that of GaAs by about 0.2 A. As the general physical constants, GaAs has a lattice constant of 5.6533 A and InP has a lattice constant of 5.8688 A.

Group III-V compound semiconductor materials lattice-matching an GaAs substrate and an InP substrate are the materials on lines perpendicular to the abscissa extending from the points of GaAs and InP plotted in the graph.

Figure 3B:
Figure 3B:
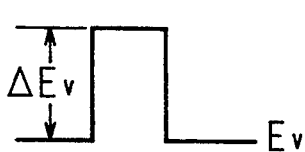
Figure 3C:
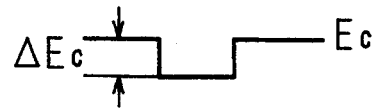
Figure 3C:

FIGS. 3B and 3C are schematic diagrams explaining the degree of band discontinuities between an active layer and a guide layer using a material lattice-matching a GaAs substrate and an InP substrate, respectively.

As shown in FIG. 3C, in the case of a semiconductor laser having an InP substrate on which lattice-matching materials are laminated to form band discontinuities between the active layer and guide layer, most of the band discontinuities appear as a band discontinuity $\Delta Ev$ at the valence band, and the band discontinuity $\Delta Ec$ at the conduction band is small as compared to $\Delta Ev$.

Since the effective mass of an electron is lighter than that of a hole, electrons cannot be confined in the active layer, and even if electrons enter once the active layer, they move out of the active layer, unless the band discontinuity at the conduction band is made large. If the band discontinuity $\Delta Ec$ at the conduction band is made deep to the degree sufficient for the confinement of electrons, the lattice mismatch becomes great.

On the other hand, the band discontinuity $\Delta Ev$ at the valence band becomes too wide. For example, in the case of an MQW structure shown in FIG. 2A, holes injected from the p-side region into the guide layer are confined in the active layer at the area nearest to the p-side region and cannot reach the area nearest to the n-side region.

In order to inject carriers uniformly by a sufficient level into the MQW structure, the depth of a band discontinuity is required not to be too deep. As a result, a ratio of $\Delta Ev$ to $\Delta Ec$ becomes important in order to provide a proper carrier confinement effect at an operating temperature.

As shown in FIG. 3B, in the case of a laser structure formed on a GaAs substrate having a lattice constant smaller than that of an InP substrate, a ratio of a band discontinuity $\Delta Ec$ at the conduction band to a band discontinuity $\Delta Ev$ at the valence band increases and becomes near 1. This phenomenon means that the ratio $\Delta Ec/\Delta Ev$ can be made larger as the material having a smaller lattice constant is used.

As seen from FIG. 3A, a semiconductor laser of the 1 $\mu$m band cannot be realized if a GaAs substrate and a material lattice-matching the GaAs substrate are used. From this reason, an InP substrate is generally used for the 1 $\mu$m band laser. In forming a laser structure on an InP substrate capable of emitting light in the 1 $\mu$m band, materials are selected from InGaAsP based materials.

Referring to FIGS. 1A and 1B, the strain buffer layer 2 is the layer for realizing an in-plane lattice constant larger than GaAs. The clad layer 7 and guide layer 6 formed on the strain buffer layer 2 have a lattice constant larger than the in-plane lattice constant at the uppermost surface of the strain buffer layer 2. The active layer 5 has a lattice constant larger than the guide layer 6, and becomes a strain active layer subjected to compression strains. Preferably, the active layer 5 is made of InGaAs having a lattice constant larger than the clad layer by 0.5% or more under a no-strain condition.

InGaP off the clad layer has a wider band gap than InGaAs of the active layer and guide layer. As a result, in the laser structure shown in FIGS. 1A and 1B, electrons injected from the lower n-type region are reflected by the upper clad layer, whereas holes injected from the upper p-type region are reflected by the lower clad layer. Use of the clad layers having a wider band gap enhances the confinement effect for electrons and holes.

However, in the laser structure shown in FIG. 1B, a lattice mismatch occurs between the active layer 5 and the guide layer 6 having a different lattice constant from the former. In order to prevent the crystal property from being degraded by a lattice mismatch, it is preferable to set the thickness of the active layer 5 thinner than a critical film thickness, or to divide the active layer 5 into two or more layers if necessary to form the MQW structure shown in FIG. 2A.

Figure 2A:
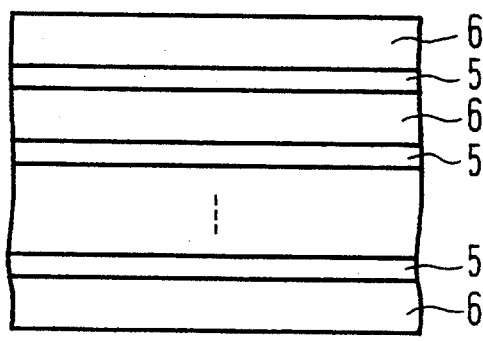
FIGS. 2A and 2B are a schematic cross sectional view and a graph explaining the embodiment shown in FIG. 1B.

In FIG. 2A, the active layer 5 is divided into a plurality of layers and dispersedly disposed in the guide layers 6. The MQW structure is effective in that a total thickness sufficient for the active layer 5 can be attained and that crystal defects to be caused by a lattice mismatch can be avoided.

If a layer whose material lattice-mismatches an underlying crystalline layer is grown, a good crystalline layer can be grown to a certain thickness. This thickness is generally called critical Film thickness. The "critical film thickness" used in this specification is defined as in the following.

Exciting light having an energy capable of exciting electron/hole pairs even in the guide layer sandwiching the active layer is applied, and a PL intensity from the active layer is measured. Under the condition that the total thickness of the active layer and guide layers is made substantially constant, as the film thickness of the active layer exceeds a certain value, the number of defects generated in the active layer becomes large and the PL intensity is greatly attenuated. If the film thickness is sufficiently thin, the PL intensity scarcely attenuates, for example, even if the film thickness of the active layer is increased by about 50%. A film thickness condition is checked at the time when the PL intensity is halved as the film thickness of the active layer is gradually increased by 50%. The film thickness increased by 50% is defined as the critical film thickness.

The present inventor measured wavelengths of light emitted from the active layer 5, by changing a composition x of the material $In_xGa_{1-x}As$ of the active layer 5 and a composition y of the material $In_yGa_{1-y}As$ of the guide layer 6.

Figure 2B:
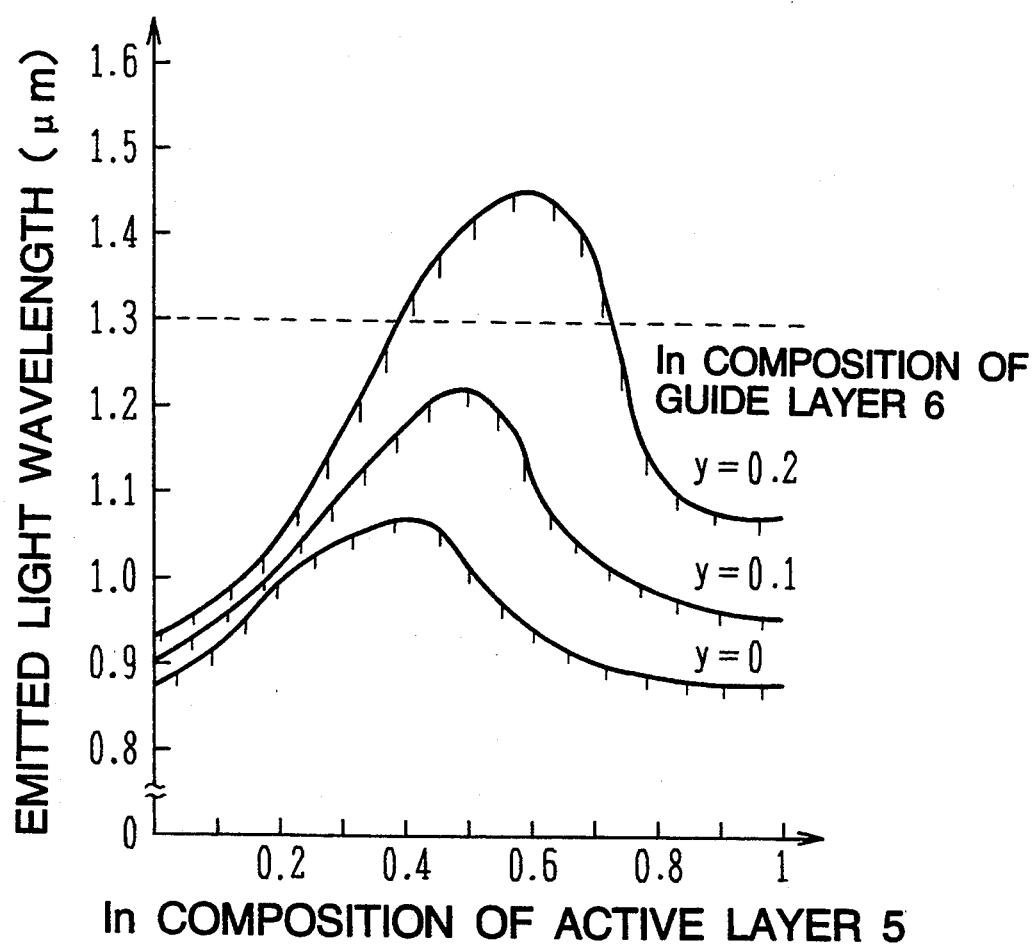

FIG. 2B is a graph showing the wavelength of light emitted from an active layer lattice-mismatching a guide layer. The abscissa represents the In composition x of the active layer 5 and the ordinate represents an emitted light wavelength in units of $\mu$m. The thickness of the active layer 5 was set at the theoretical critical film thickness given by Matthews. The critical film thickness defined before is an empirical value, and is generally smaller than the theoretical value. Three curves shown in this graph indicate changes in the emitted light wavelength relative to the In composition x of the active layer 5, respectively at the In compositions y of 0, 0.1, and 0.2 of the guide layer 6.

A lattice match is obtained at $x=y$ and there is no limit in the thickness of the active layer. As a difference between the compositions x and y becomes great, the degree of lattice mismatch becomes great and the critical film thickness of the active layer becomes thin.

In each curve shown in FIG. 2B, as the In composition increases, the degree of lattice mismatch becomes great and the critical film thickness becomes thin.

As shown in FIG. 3A, as the In composition of InGaAs increases, the band gap becomes narrow. This narrowed band gap corresponds to the tendency that as the In composition x of the active layer 5 increases, the wavelength of emitted light becomes longer as shown in FIG. 2B.

As a difference between the In composition x of the active layer and the In composition y of the guide layer becomes large, the critical film thickness of the active layer becomes considerably thin. As a result, an MQW structure using a thin active layer becomes necessary.

As the thickness of the active layer becomes thin, an effective band gap in the active layer is widened because of the quantum effect. This quantum effect operates in such a manner as the emitted light wavelength shown in FIG. 2B is made to become gradually longer, to saturate, and to become gradually shorter, irrespective of an increase of the In composition x of the active layer 5.

If the thickness of the active layer is made thinner than the critical film thickness, shortening the emitted light wavelength is further speeded up. As a result, the emitted light wavelength realizable by combinations of the compositions of the active layer 5 and guide layer 6 shown in FIG. 2B positions under the curves shown in FIG. 2B.

Although light of 1.3 μm cannot be emitted if the guide layer 6 is made of $In_{0.1}Ga_{0.9}As$, light of 1.3 μm can be emitted with ease by using the guide layer 6 having a composition of $In_{0.2}Ga_{0.8}As$.

It has found also that the band discontinuity ΔEc at the conduction band as referenced to the band discontinuity ΔEv at the valence band can be made larger the less the P fraction, if the band gap necessary between the active layer and guide layer is realized by using InGaAsP. If the same band gap is to be obtained by reducing the P composition, the In composition is required to be reduced generally by the same amount corresponding to the reduction of the P composition, thereby resulting in a smaller lattice constant. The guide layer is preferably made of InGaAsP having a P molar fraction of 0.3 or smaller in group V elements.

It has been confirmed eventually that using the active layer and guide layer having as small a lattice constant as possible is effective in increasing the ratio ΔEc/ΔEv. As seen from FIG. 2B, it is desired to set the In composition x of the guide layer at least equal to 0.2 in order to emit light having a wavelength of 1.3 μm or longer. In order to obtain as small a lattice constant as possible in such a composition range, it is preferable that the composition of the guide layer 6 is $In_{0.2}Ga_{0.8}As$.

Also, by using a quantum well or wells of larger In Fraction for the acitve layer 5 to produce compressive strain, it is possible to form a semiconductor laser of a lasing wavelength 1.3 μm with smaller lattice constant. There is also obtained at the same time a merit of improved emission efficiency by the introduction of the strain. For realizing a sufficient improvement of the emission efficiency, the difference of the lattice constant between the clad layer and the active layer is desirablly at least 0.5% of the lattice constant of the clad layer.

The structure shown in FIGS. 1A and 1B has been designed based upon the above-described studies.

As seen from FIG. 3A, the lattice constant of InGaAs having a band gap corresponding to the wavelength 1.3 μm is about 5.83 A. Since a difference of a lattice constant between the clad layer and active layer is preferably 0.5% or more, an upper limit of a preferred lattice constant can be determined.

If there is a large mismatch of a lattice constant between the clad layer and active layer, the critical film thickness becomes thin so that it becomes difficult to manufacture a laser structure as the emitted light wavelength becomes short. Since it is necessary to set the critical film thickness to have a proper value, the lower limit of the preferred lattice constant of the clad layer can be determined. That is, the lattice constant of the clad layer is preferably set larger than that of GaAS by about 1.5% to 2.5%.

The lattice constant of InGaAs having a band gap corresponding to the wavelength 1.55 μm is about 5.89 A. From the same observation as above, it is preferable to select the lattice constant of the clad layer which is larger than that of GaAs by about 2.3% to 3.0%.

In a semiconductor laser having an SCH (separated confinement hetero) structure with guide layers, the active layer is sandwiched between guide layers, and clad layers are disposed outside the guide layers. The active layer has a narrowest band gap, the guide layer has a wider band gap than the active layer, and the clad layer has a widest band gap.

Figure 4A:
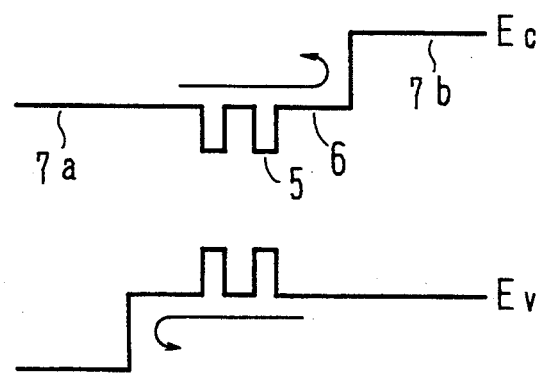
FIGS. 4A and 4B are a diagram and a schematic sectional view explaining a semiconductor laser according to another embodiment of the present invention.

FIG. 4A is a schematic diagram explaining the band structure in the laser structure having an SCH structure. One clad layer 7a is in the n-type region, and the other clad layer 7b is in the p-type region. Between this pair of clad layers, guide layers 6 are inserted sandwiching the active layer 5. The active layer 5 is divided into two layers to form an MQW structure.

Electrons injected from the n-type clad layer 7a propagate to the p-type clad layer 7b if they are not trapped by the active layer 5. If the potential barrier of the clad layer 7b relative to the guide layer 6 is sufficiently high, electrons are reflected by the clad layer 7b and again move to the active layer. Similarly, holes injected from the p-type clad layer 7b propagate to the n-type clad layer 7a if they are not trapped by the active layer 5. If the potential barrier of the n-type clad layer 7a is sufficiently high, holes are reflected and again move to the active layer 5.

If the clad layer forms a sufficiently high potential barrier relative to the guide layer, the confinement effect of carriers is enhanced. Such a band gap structure is reflected upon the reflectance distribution, and a light confinement effect as well as the carrier confinement effect can be enhanced. In order to enhance such confinement effects, it is preferable to use a material of the clad layer having as wide a band gap as possible.

Referring back to FIG. 3A, if an InGaAsP based mixed crystal is used for the guide layer, InGaP has a maximum band gap. If a substrate is made of InP. an InGaP based mixed crystal having a maximum band gap and lattice-matching InP is InP. This fact coincides with that a conventional technique has used InP as the clad layer of a laser structure. If the lattice constant of an underlying crystal is smaller than that of InP, it is possible to further widen the band gap of the clad layer.

In the embodiment shown in FIGS. 1A and 1B, use of $In_{0.7}Ga_{0.3}P$ as the clad layer signifies an enhancement of the confinement effect by forming the clad layer by the material having the widest band gap among INGaAsP based materials.

As seen from FIG. 3A, there are materials having a band gap wider than InGaP and having the same lattice constant as InGaP. Specifically, they are AlGaInAsP in the range between an INGaP curve and an AlInP curve and in the lattice constant range between the GaAs lattice constant and InP lattice constant. Use of AlGaInAsP realizes a band gap wider than InGaP and the same lattice constant as InGaP.

Figure 4B:
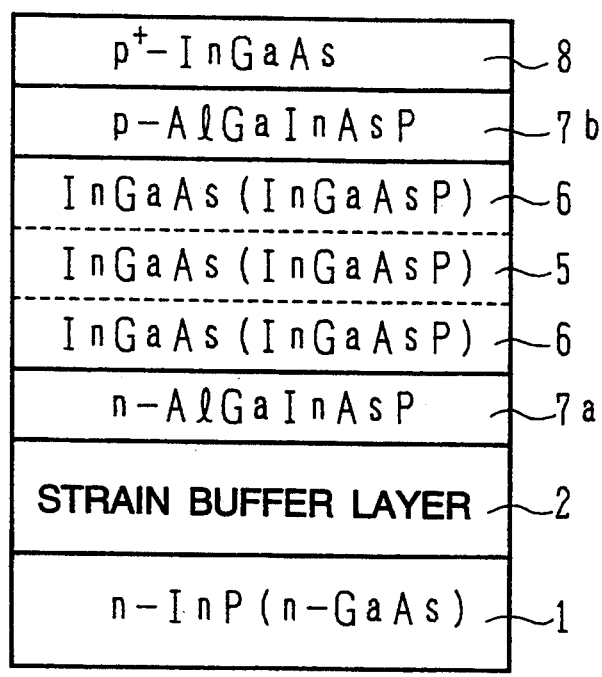

FIG. 4B shows the laser structure having a clad layer made of a wide band gap material. InGaAs or InGaAsP is used as an active layer 5 and guide layers 6 like the embodiment shown in FIGS. 1A and 1B, and AlGaInAsP in the oblique line region shown in FIG. 3A is used as clad layers embracing the guide layers 6. In the n-type region, an n-type AlGaInAsP clad layer 7a is used, and in the p-type region, a p-type AlGaInAsP clad layer 7b is used.

An n-type InP or n-type GaAs is used as a substrate 1. A strain buffer layer 2 is grown on the substrate 1 to change an in-plane lattice constant and to match the lattice constants of the clad layer and guide layer. The layers 5, 6, and 7 of the laser structure described above are grown on the strain buffer layer 2, and a p+-type InGaAs layer is formed thereon as a p-type contact layer 8.

With this structure, a high potential barrier can be formed between the guide layer 6 and clad layer 7. Therefore, diffused carriers not trapped by the active layer can be reflected efficiently and again moved toward the active layer.

If a layer having a different lattice constant is grown on a substrate, a number of strains are generated, and dislocations are generated when strains are relaxed. A structure for suppressing a penetration of such dislocations into the active layer is desired. It is also necessary to grow a strain buffer layer sufficiently thick for relaxing strains. Therefore, it is desired to relieve strains by using a thinner strain layer.

Figure 5A:
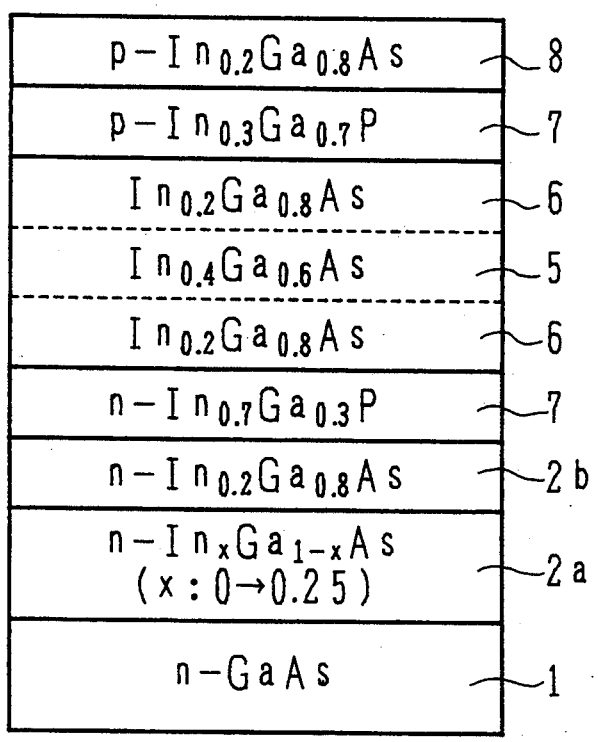
FIGS. 5A and 5B are schematic cross sectional views explaining a laminated structure of semiconductor lasers according to other embodiments of the present invention.
Figure 5B:
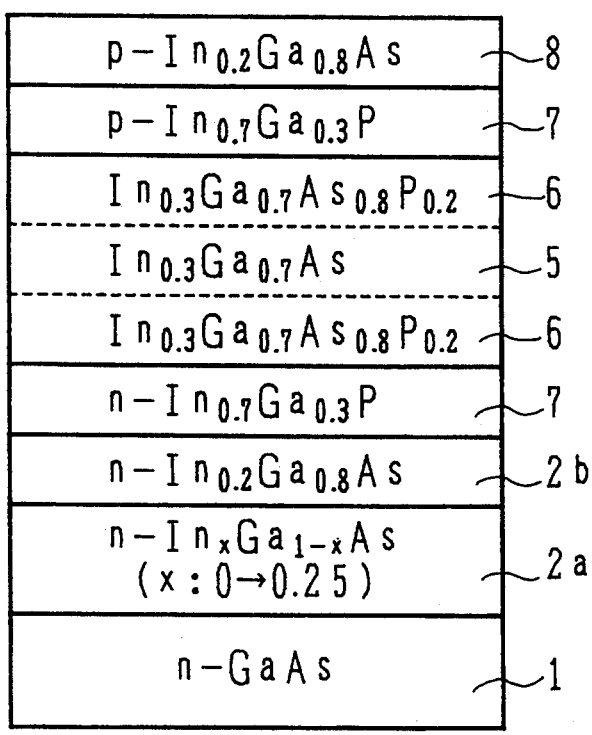

FIGS. 5A and 5B show the laser structures capable of readily relieving a lattice mismatch between a substrate and a laser structure, eliminating strains, and suppressing a penetration of generated dislocations into an active layer.

Referring to FIG. 5A, on an n-type GaAs substrate 1, a gradient composition layer 2a of n-type $In_xGa_{1-x}As$ is first grown, where the composition x is gradually changed from 0 to 0.25. On the gradient composition layer 2, a uniform composition layer 2b is grown which is n-type $In_{0.2}Ga_{0.8}As$ having a uniform composition smaller than the maximum composition 0.25 of the gradient composition layer 2a by 5%.

Therefore, the lattice constant inherent to the crystal gradually increases in the gradient composition layer 2a on the substrate 1 and takes a reduced constant value in the uniform composition layer 2b.

On the uniform composition layer 2b, the layers 5, 6, 7 of the laser structure and a contact layer 8 like that shown in FIGS. 1A and 1B are epitaxially grown.

Figure 6:
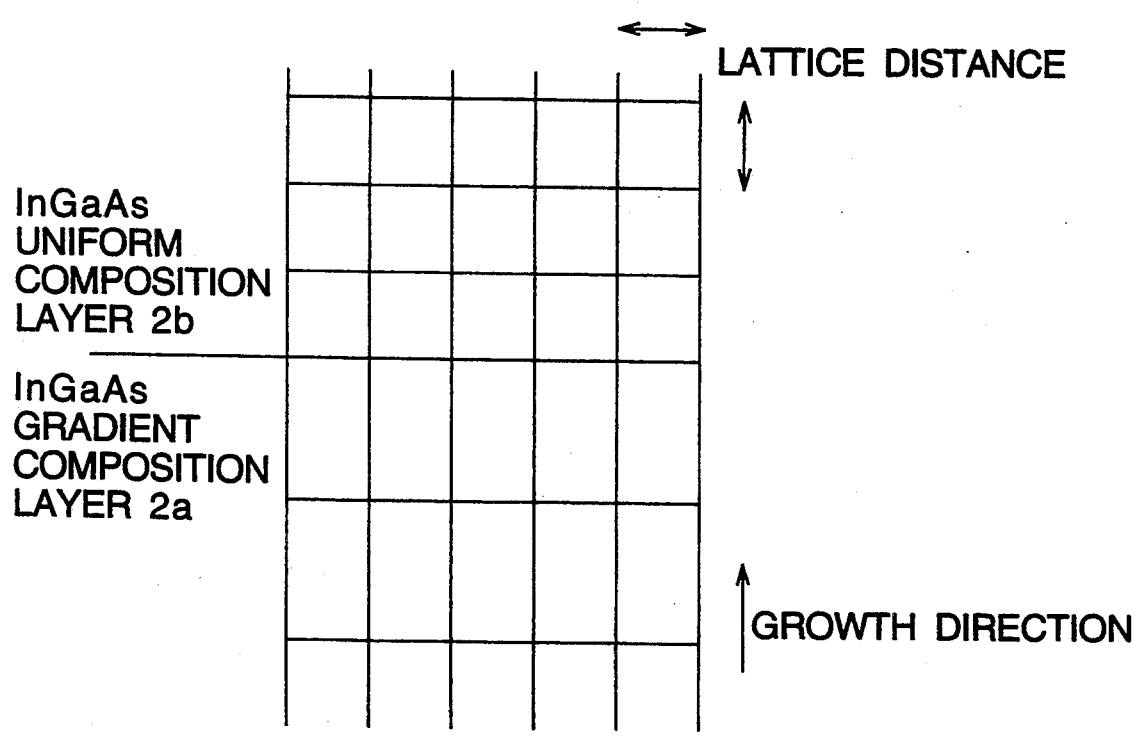
FIG. 6 is a schematic diagram explaining the strain relaxing effect of the embodiment shown in FIG. 5A.

FIG. 6 is a schematic diagram showing a change in a lattice of the buffer layer made of a gradient composition layer 2a and uniform composition layer 2b shown in FIG. 2A. In the gradient composition layer 2a, the lattice constant inherent to the crystal gradually increases.

However, in the gradient composition layer 2a formed on the substrate 1, the in-plane lattice constant cannot increase so much under the constraint of the lattice constant of the substrate. This is, the lattice is compressed in the in-plane direction, and deformed to be elongated in the direction perpendicular to the crystal plane.

Specifically, in the gradient composition layer 2a, although the in-plane lattice constant gradually increases, a compression stress is acting upon it. On the other hand, the lattice constant of the uniform composition layer 2b grown on the gradient composition layer 2a is selected so as to lattice-match the in-plane lattice constant at the uppermost surface of the gradient composition layer 2a. Therefore, the lattice in the uniform composition layer 2b grows without deformation, thus forming a non-strain uniform composition layer.

In order to verify this strain relieving mechanism, three samples were prepared having gradient composition layers 2a of 1 μm thick, 1.5 μm thick, and 2.4 μm thick, respectively, and having a continuously and linearly changed composition. Each sample also had a uniform composition layer 2b of 1 μm thick, clad layers 7 of 0.1 μm thick, guide layers 6 of 0.05 μm thick, and an active layer 5 of 5 nm thick.

By using these three kinds of samples, photo luminescence PL from the active layer was measured. A maximum PL intensity was obtained by the sample having the gradient composition layer 2a of 1.5 μm thick. It can be hypothesized that the sample having the gradient composition layer 2a of 1.5 μm thick among the three samples had the in-plane lattice constant nearest to the lattice constant of the $In_{0.2}Ga_{0.8}As$ uniform composition layer.

In this embodiment, the composition of the gradient composition layer is intentionally changed to obtain both the effects of thickness and composition change. It was found that the in-plane lattice constant of the gradient composition layer of 1.5 μm thick had the in-plane lattice constant nearest to the lattice constant of the $In_{0.2}Ga_{0.8}As$ uniform composition layer.

The images of the cross section of each sample were taken by a transmission electron microscope. It was found that locations generated in the gradient composition layer 2a and confined therein and that dislocations penetrating into the active layer were rare.

It is therefore possible to reduce dislocations penetrating into the active layer as many as possible by using the gradient composition layer. In addition, a proper combination of lattice constants of the gradient composition layer and uniform composition layer enables to obtain a thinner strain relieving layer with a non-strain crystal surface.

In the above embodiment, the In composition x of 0.25 of the gradient composition layer 2a at the uppermost surface thereof and the In composition x of 0.2 of the uniform composition layer have been used. The In composition may be set to other values. For example, the In composition x of the gradient composition layer 2a at the uppermost surface thereof may be set in the range from 0.2 to 0.35, and the In composition x of the uniform composition layer may be set smaller the In composition x of the gradient composition layer at the uppermost surface thereof, with a difference therebetween being set to 0.05 or smaller.

If InP is used for the substrate, the composition of the gradient composition layer is changed so that the lattice constant gradually reduces as the gradient composition layer grows on the substrate. In this case, the In composition x of the uniform composition layer is set larger than the In composition x of the gradient composition layer at the uppermost surface thereof.

The strain buffer layer for absorbing a lattice mismatch between the substrate and clad layer has strains on the crystal surface so that the surface of an epitaxial layer formed thereon becomes uneven. This unevenness is less in the [1 1 0] direction and greater in the [−1 1 0] direction perpendicular to the [1 1 0] direction. It is therefore preferable to set the cavity direction of a semiconductor laser in the [1 1 0] direction. The unevenness in the [1 1 0] cavity direction is less, thus reducing scattering of light reciprocally moving in the cavity.

The strain buffer layer formed by a combination of the gradient composition layer and uniform composition layer may be applied to other laser structures.

FIG. 5B shows another laser structure using the strain buffer layer formed by a combination of the gradient composition layer and uniform composition layer. On an n-type GaAs substrate 1, a gradient composition layer 2a having an impurity concentration of $1 \times 10^{18} cm^{-3}$ is grown to a thickness of about 1.5 μm by linearly and gradually changing the composition x from 0 to 0.25.

On the gradient composition layer 2a, a uniform composition layer 2b is grown having a constant composition of $In_{0.2}Ga_{0.8}As$. The uniform composition layer 2b is an n-type layer having a thickness of 1.0 μm and an n-type impurity concentration of $1\times10^{18}cm^{-3}$.

On the uniform composition layer 2b, an n-type $In_{0.7}Ga_{0.3}P$ clad layer 7 is grown to a thickness of 1.0 μm having an n-type impurity concentration of $1\times10^{18}cm^{-3}$. On the clad layer 7, an SCH (separated confinement hereto) structure is formed, this structure having an undoped $In_{0.3}Ga_{0.7}As$ active layer 5 of a thickness 0.02 μm and guide layers 6 embracing the active layer. The guide layer 6 is made of undoped $In_{0.3}Ga_{0.7}As_{0.8}P_{0.2}$ and has a thickness of 0.1 μm. The guide layer 6 having a four-element composition provides a wide band discontinuity.

On this SCH structure, a clad layer 7 of p-type $In_{0.7}Ga_{0.3}P$ is grown which has a thickness of 1.0 μm and a p-type impurity concentration of $1\times10^{18}cm^{-3}$. On the clad layer 7, a p-type $In_{0.2}Ga_{0.8}As$ contact layer 8 is grown which has a thickness of 0.5 μm and a p-type impurity concentration of $3\times10^{19}cm^{-3}$.

The epitaxial structure shown in FIG. 5B was used to form a ridge type semiconductor laser shown in FIG. 1A. This semiconductor laser had a cavity length of 900 μm and could show lasing operation at a lasing wavelength of 1.15 μm at a current density of 500 A/cm².

Next, the relationship between a film thickness of a gradient composition layer and a quality of an active layer will be explained.

Figure 7:
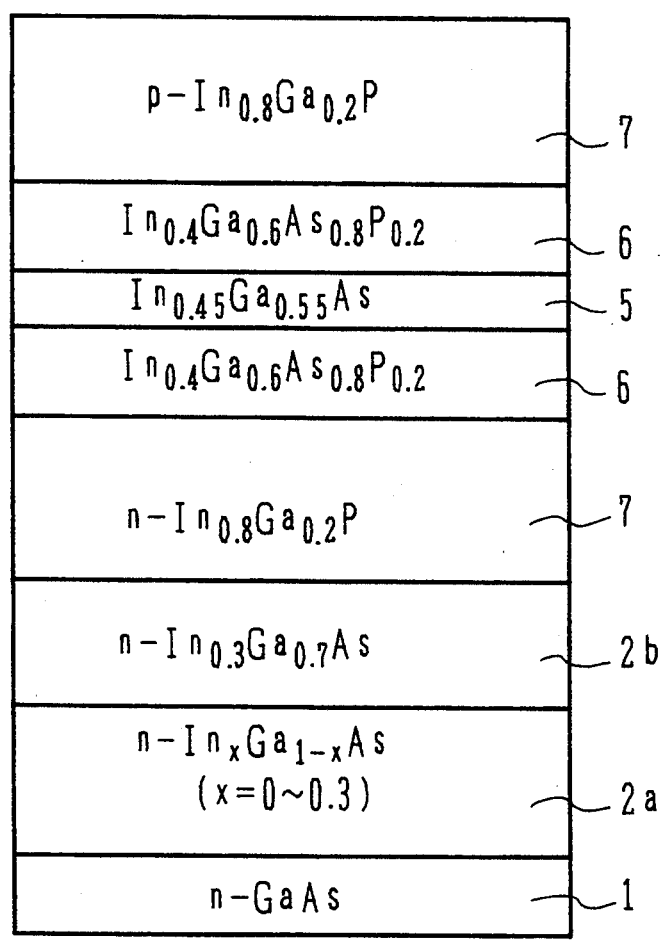
FIG. 7 is a schematic cross sectional view explaining a laminated structure of a semiconductor laser according to another embodiment of the present invention.

FIG. 7 shows another example of the structure of a semiconductor laser rising a buffer layer formed by a combination of a gradient composition layer and a uniform composition layer. On an n-type GaAs substrate 1, an $In_xGa_{1-x}As$ gradient composition layer 2a having an n-type impurity concentration off $1\times10^{18}cm^{-3}$ is grown to a thickness of 0.5 to 2.4 μm by linearly and gradually changing the composition x from 0 to 0.3.

On the gradient composition layer 2a, a uniform composition layer 2b is grown having a constant composition of $In_{0.3}Ga_{0.7}As$. The uniform composition layer 2b is an n-type layer having a thickness of 1.0 μm and an n-type impurity concentration of $1\times10^{18}cm^{-3}$.

On the uniform composition layer 2b, an n-type $In_{0.8}Ga_{0.2}P$ clad layer 7 is grown to a thickness of 1.0 μm having an n-type impurity concentration of $1\times10^{19}cm^{-3}$. On the clad layer 7, an SCH (separated confinement hetero) structure is formed, this structure having an undoped $In_{0.45}Ga_{0.55}As$ active layer 5 of a thickness 5 nm and guide layers 6 embracing the active layer. The guide layer 6 is made of undoped $In_{0.4}Ga_{0.6}As_{0.8}P_{0.2}$ and has a thickness of 0.1 μm. On this SCH structure, a clad layer 7 of p-type $In_{0.8}Ga_{0.2}P$ is grown which has a thickness of 1.0 μm and a p-type impurity concentration of $1\times10^{18}cm^{-3}$.

Figure 8:
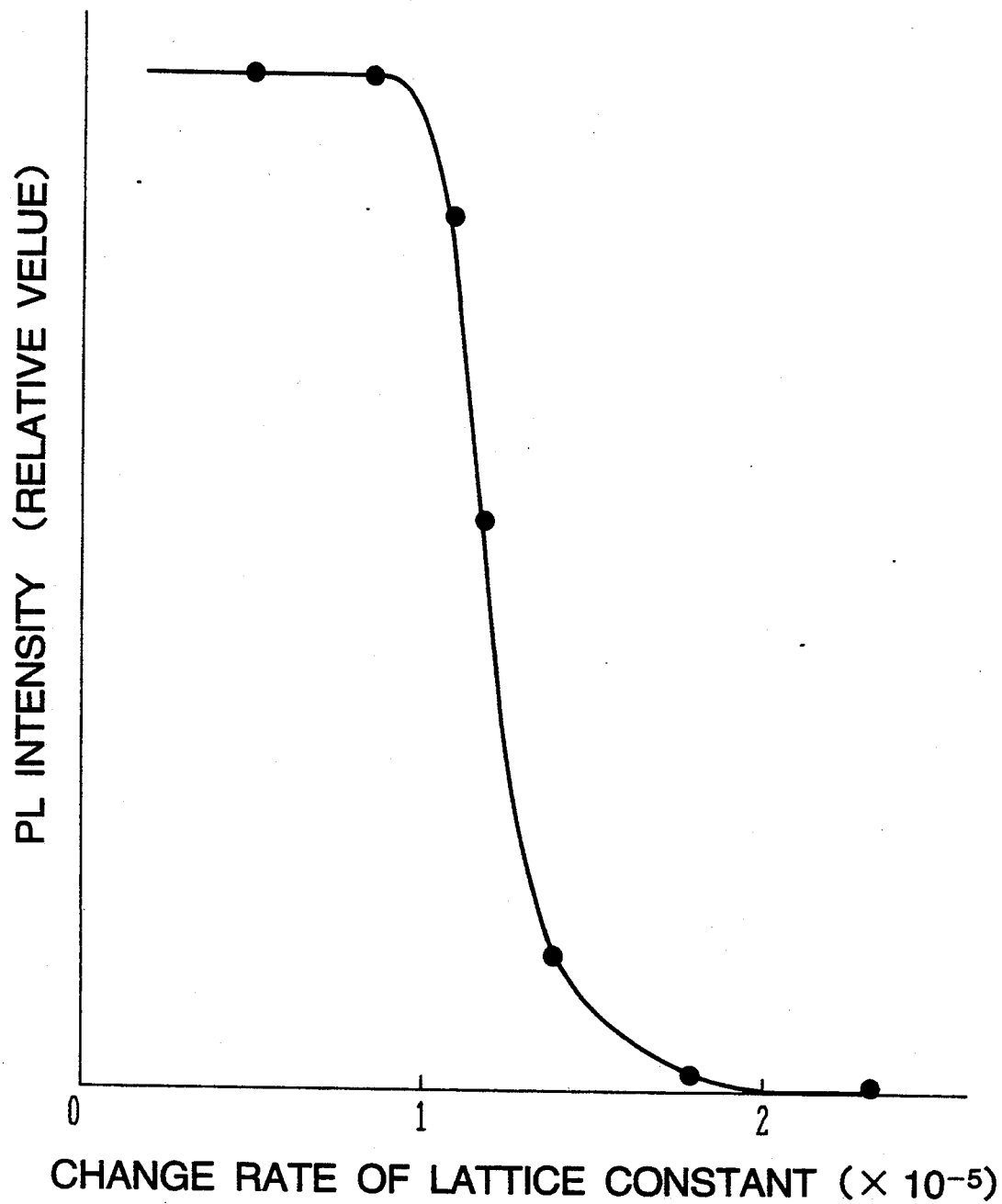
FIG. 8 is a graph showing the relationship between a change rate of a lattice constant of the gradient composition layer of the semiconductor laser shown in FIG. 7 relative to a PL intensity of the active layer.

FIG. 8 shows a change in a photo luminescence PL intensity from the active layer 5 of the laminated structure shown in FIG. 7. Exciting light having an energy sufficient even for the guide layers 6 to excite electron/hole pairs was used. Accordingly, electron/hole pairs excited at the guide layers 6 also injected into the active layer 5 in which electron/hole pairs recombined and emitted light.

The abscissa represents a change rate of a lattice constant per unit film thickness of the gradient composition layer 2a. This change rate is represented by $|(a4-a3)/d1|$ where d1 is a film thickness of the gradient composition layer 2a, a3 is a lattice constant of the gradient composition layer at a no-strain state at the interface with the substrate 1, and a4 is a lattice constant of the gradient composition layer at a no-strain state at the uppermost surface thereof. The absolute value symbols are added because if InP is used as the substrate, A3>a4 and so (a4−a3)/d1 is negative. The ordinate represents a PL intensity at an optional scale.

Light emission was hardly recognized at the lattice constant change rate of $2\times10^{-5}$ or higher. This can be hypothesized that a number off dislocations generated in the gradient composition layer 2a reach the active layer 5 because the lattice constant change rate in the gradient composition layer 2a is steep.

As the lattice constant change rate became smaller than $2\times10^{-5}$, the PL intensity gradually increased. When the change rate reached $1.6\times10^{-5}$, the PL intensity increased more, at $1.2\times10^{-5}$ it increased steeply, and at $0.9\times10^{-5}$ it almost saturated. This can be hypothesized that the number of dislocations penetrating into the active layer reduces at a smaller lattice constant change rate. It is also hypothesized that the density of dislocations in the active layer 3 becomes so small at the change rate lower than $0.9\times10^{-5}$ or smaller, thereby not hindering the performance of light emitting material.

As seen from FIG. 8, it is preferable that the change rate of a lattice constant in the gradient composition layer is $1.6\times10^{-8}$ or smaller per unit film thickness. More preferably, the change rate is $1.2\times10^{-5}$ or smaller and still note preferably $0.9\times10^{-5}$ or smaller.

Next, the influence of the strain amount and film thickness of the active layer upon the quality of the active layer will be explained.

Figure 9:
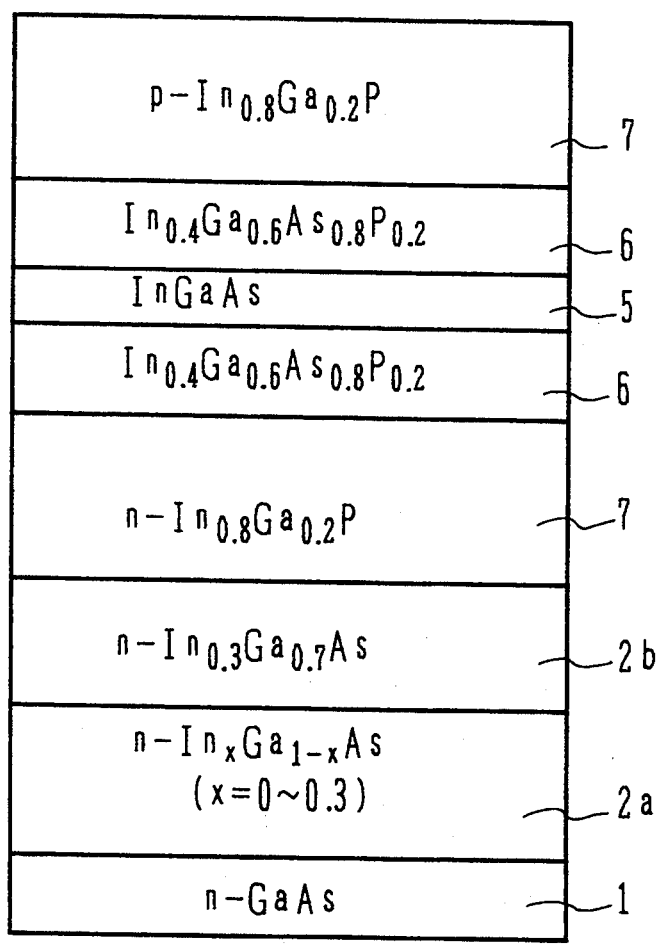
FIG. 9 is a schematic cross sectional view explaining the laminated structure off a semiconductor laser according to another embodiment of the present invention.

FIG. 9 shows another example of the structure of a semiconductor laser using a buffer layer formed by a combination of a gradient; composition layer and a uniform composition layer. The compositions and film thicknesses of a gradient composition layer 2a, a uniform composition layer 2b, clad layers 7, and guide layers 6 are the same as the semiconductor laser shown in FIG. 7, excepting that the film thickness of the gradient composition layer 2a is 2 μm which is in the range ensuring a sufficient PL intensity of the structure shown in FIG. 7.

Figure 10:
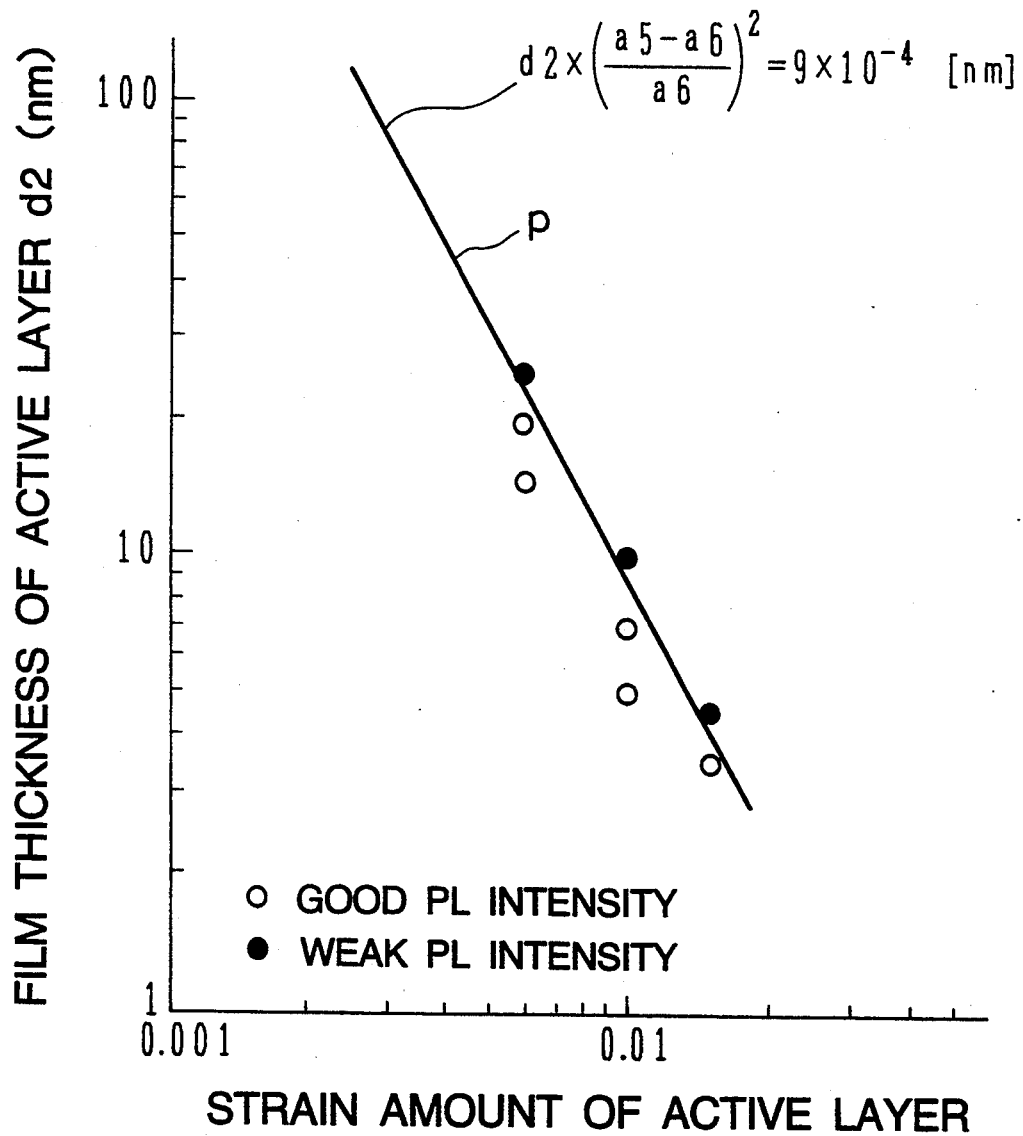
FIG. 10 is a graph showing the relationship between a strain amount relative to a film thickness of the active layer of the semiconductor laser shown in FIG. 9 capable of obtaining a good PL intensity.

FIG. 10 shows a change in a photo luminescence PL intensity from the active layer 5 of the laminated structure shown in FIG. 9, relative to the composition and film thickness of the active layer 5. The abscissa represents a strain amount in the active layer 5 which amount is represented by $(a5−a6)/a6$ where a5 is a lattice constant specific to the active layer 5 at a no-strain state, and a6 represents a lattice constant of the clad layer 7. If the film thickness of the active layer 5 epitaxially grown on the guide layer 6 above the clad layer 7 is sufficiently thin, the lattice constant of the active layer 5 matches that of the clad layer 7. The ordinate represents the film thickness d2 of the active layer 5 in nm.

A circle indicates a sample which obtained a good PL intensity, and a solid black circle indicates a sample which obtained a PL intensity half the good PL intensity or smaller. The solid line p in FIG. 10 indicates therefore a critical film thickness relative to the strain amount off the active layer 5.

Samples in the area under the solid line p in FIG. 10 obtained a good PL intensity. This can be hypothesized that although the active layer 5 can be epitaxially grown matching the lattice constant of the clad layer 7 if the film thickness of the active layer 5 is a critical film thickness or thinner, crystal defects such as dislocations increase as the film becomes thick.

From FIG. 10, it is seen that a good PL intensity can be obtained by selecting a5, a6, and d2 so as to satisfy $d2 \times \{(a5-a6)/a6\}^2 < 9 \times 10^{-4}$.

For obtaining a sufficient effect of improving the emission efficiency by the introduction of a strained active layer, the difference of the lattice constant between the clad layer and the active layer is preferably at least 0.5% of the lattice constant of the clad layer. Namely, it is desired that $(a5-a6)/a6 > 5 \times 10^{-3}$.

In FIG. 9, the active layer of a predetermined InGaAs is used. Instead, the active layer of a short period superlattice structure may be used in which an InAs layer and a GaAs layer are alternately laminated. This short period lattice structure can suppress the generation of defects by strains. The InAs layer and GaAs layer are not necessarily laminated alternately one complete layer after another, but they may be laminated in units of 0.7 to 1 layer. A layer less than one layer means a layer which hasn't a complete grown surface of superlattice but partially exposes the underlying layer.

If a single strain buffer layer or a strain buffer layer formed by a combination of a gradient composition layer and a uniform composition layer is grown on a substrate, dislocations are generated by a lattice mismatch and the crystal property is degraded, resulting in an uneven crystal surface.

Figure 11A:
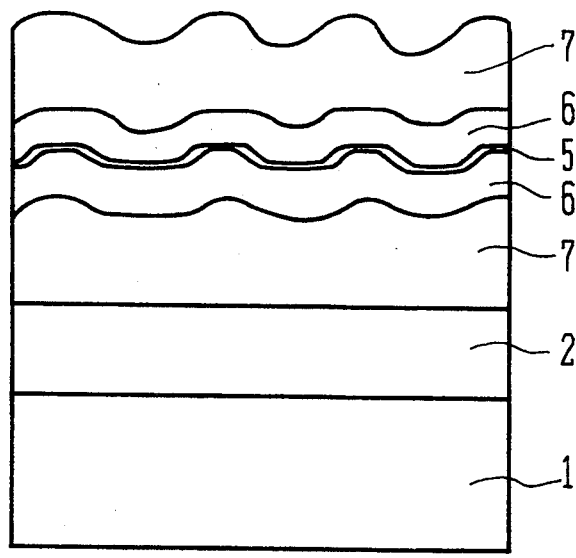
FIGS. 11A and 11B are a schematic cross sectional view and a graph explaining the effect of doping Se.

FIG. 11A is a schematic cross sectional view exaggeratively illustrating an adverse effect on a strain buffer layer. On a GaAs substrate 1, a InGaAs strain buffer layer 2 is grown. On the strain buffer layer 2, an n-type InGaP clad layer 7 is grown. The surface of the clad layer 7 becomes uneven.

The surface unevenness is expanded if an undoped InGaAs P guide layer 6, an undoped InGaAs active layer 5, an undoped InGaAsP guide layer 6, and a p-type InGaP clad layer 7 are further grown. There is a high possibility of adversely affecting the electric and optical properties of the active layer 5 by the surface unevenness and internal crystal defects. In a particular case wherein a strain active layer is used as the active layer 5, strains become ununiform because of the surface unevenness and the crystal property may be damaged.

It has been found that such surface unevenness and crystal property degradation caused by a strain buffer layer can be suppressed by using Se impurities.

Figure 11B:
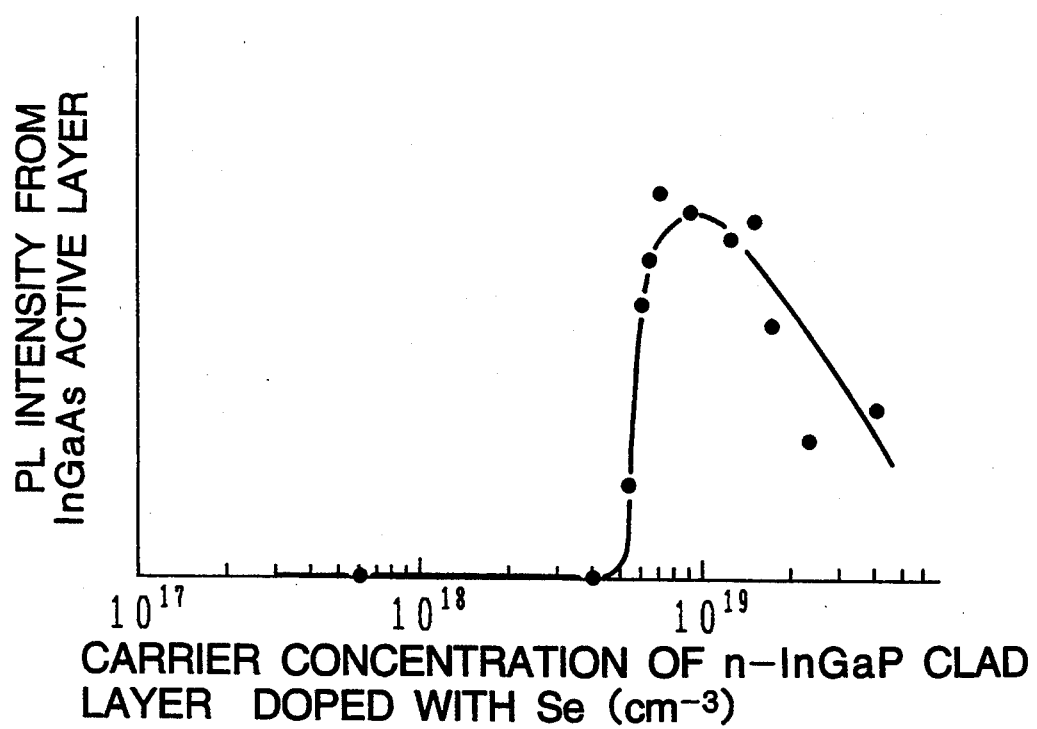
Figure 12:
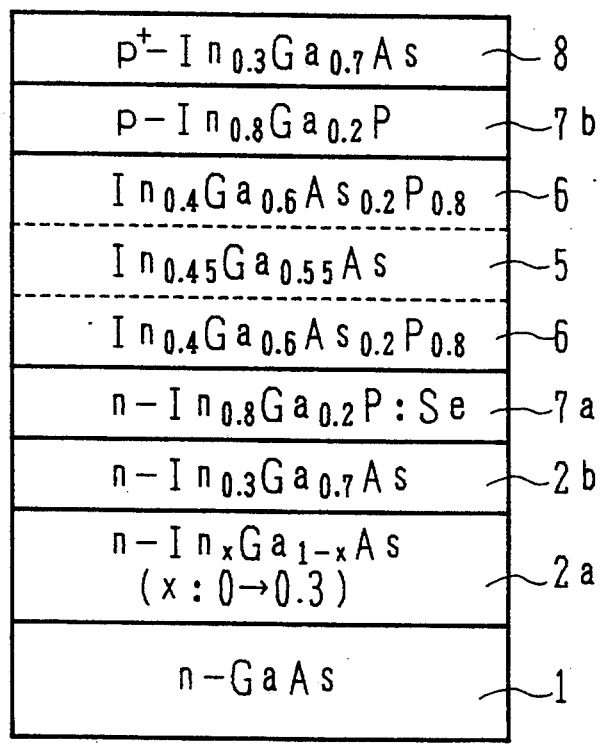
FIG. 12 is a schematic cross sectional view of a Se doped semiconductor laser according to another embodiment of time present invention.

FIG. 11B shows the measurement results of a PL intensity obtained from the active layer 5, in which n-type Se impurities were doped into the n-type clad layer 7 shown in FIG. 12. The abscissa represents a carrier concentration in the n-type InGaP clad layer 7 with doped Se impurities, and the ordinate represents the PL intensity from the InGaAs active layer at an optional scale.

The PL intensity obtained from the active layer started rising when the carrier concentration of the Se doped n-type clad layer 7 exceeded $4 \times 10^{18} cm^{-3}$, steeply rose at the concentration of $5 \times 10^{18} cm^{-3}$ or higher, and showed a peak at the concentration of about $1 \times 10^{19} cm^{-3}$. At the carrier concentration of $2 \times 10^{19} cm^{-3}$ or higher, the PL intensity started lowering, and took a considerably low value at the concentration of $3 \times 10^{19} cm^{-3}$.

In the carrier concentration range from $6 \times 10^{18} cm^{-3}$ to $1.5 \times 10^{19} cm^{-3}$, generally the same PL intensity was obtained. The surface unevenness of a layer above the clad layer also reduced by Se doping.

FIG. 12 shows an embodiment of a semiconductor laser having an n-type clad layer doped with Se. On an n-type GaAs substrate 1 having the (1 0 0) plane, an n-type $In_xGa_{1-x}As$ gradient composition layer 2a is grown to a thickness of 2 $\mu m$ by linearly changing the composition x from 0 to 0.3. On the gradient composition layer 2a, a uniform composition layer 2b is grown to a thickness of 1 $\mu m$ having a constant composition of n-type $In_{0.3}Ga_{0.7}As$. The gradient composition layer 2a and uniform composition layer 2b constitute a strain buffer layer.

On the strain buffer layer, an n-type-$In_{0.8}Ga_{0.2}P$ clad layer 7a doped with Se as n-type impurities at a concentration of $9*10^{18} cm^{-3}$ is grown to a thickness of 1.0 $\mu m$. On the n-type clad layer 7a, an SCH structure is formed having an undoped $In_{0.45}Ga_{0.55}As$ active layer 5 and guide layers 6 embracing the active layer are formed. The guide layer 6 is made of undopod $In_{0.4}Ga_{0.6}As_{0.2}P_{0.8}$ and has a thickness of 0.1 $\mu m$. On this SCH structure, a p-type clad layer 7b of p-type $In_{0.8}Ga_{0.2}P$ is grown which has a p-type impurity concentration off $1 \times 10^{18} cm^{-3}$. A p-type $In_{0.3}Ga_{0.7}As$ contact layer 8 having a p-type impurity concentration of $3 \times 10^{19} cm^{-3}$ is grown on the p-type clad layer 7b.

The contact layer 8 and p-type clad layer 7b are etched to form a mesa type shown in FIG. 1A. The thickness of the ridge layer is about 1 $\mu m$, and the thickness of the p-type clad layer under the ridge layer is about 0.15 $\mu m$. The width of the mesa is about 5 $\mu m$ at the uppermost surface thereof.

Since the n-type clad layer under the SCH structure is doped with Se at the concentration of $9 \times 10^{18} cm^{-3}$, the surface of the clad layer 7a is made flat from the reason described previously, and the PL intensity from the SCH structure on the clad layer 7a can be increased. An increase of the PL Intensity corresponds to an improvement on the crystal property, resulting in an improved light emission efficiency. This semiconductor laser oscillated at an oscillation wavelength of 1.3 $\mu m$ and at a current density of 300 A/cm² and had a cavity length of 900 $\mu m$. The characteristic temperature was 70 K.

Although Se has been used as n-type impurities, the same effects can be expected by using other group VI chalcogen elements such as S and Te as n-type impurities.

An InGaAsP mixed crystal can grow reliably on not all crystal layers. In growing a laser structure on an underlying InGaAs crystal having an In composition of about 0.25, a composition of a guide layer suitable for providing a proper $\Delta Ec$ is an InGaAsP composition at a non-miscible region. It is known that INGaAsP in the non-miscible region cannot be grown in a liquid phase.

The present inventors grew an InGaAsP crystal in the miscibility gap by metal organo chemical vapor deposition (MOCVD). Although the crystal in the non-miscible region grew, the PL intensity obtained from this layer was extremely weak. In other words, a good crystal property was not obtained. It has been found that crystal having a quality suitable for use as a laser cannot be obtained.

Figure 13A:
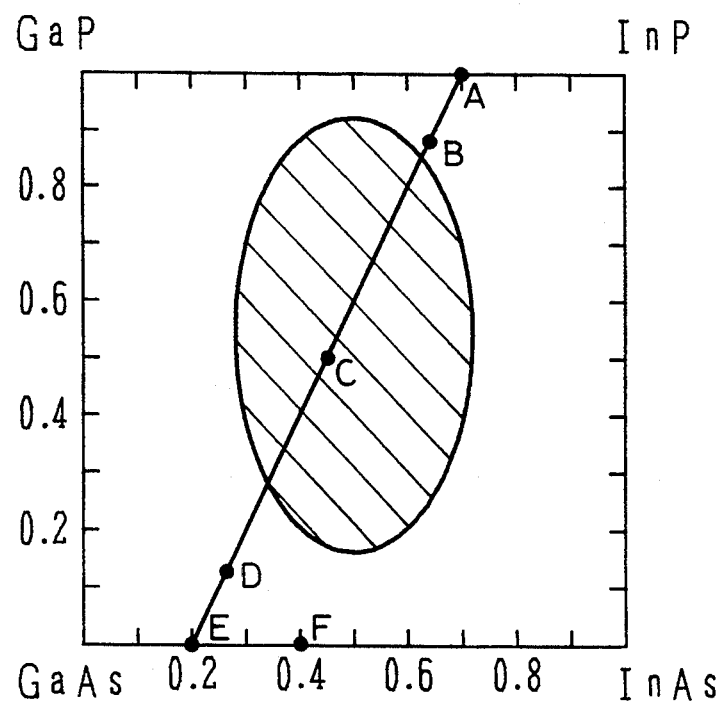
FIGS. 13A and 13B are a graph and a schematic cross sectional view explaining a semiconductor Laser according to another embodiment of the present invention.

FIG. 13A is a graph showing the region in which a weak PL intensity was obtained from an InGaAsP mixed crystal layer grown by MOCVD at a growth temperature of 650° C. A region of InGaAsP mixed crystal using GaP, GaAs, InAs, InP as terminal materials corresponds to a rectangle in the graph. The region indicated by oblique lines corresponds to the region in which the PL intensity was weak, this region corresponding to the non-miscible region.

The guide layer and clad layer are required to grow outside of this region. If a desired composition is C, crystal having this composition C cannot be grown reliably. Crystals having the compositions A, B, D, E, and F outside of the region can be reliably grown.

If the band gap and reflectance of a crystal having the composition C are desired, crystals having the compositions B and D on opposite sides of the composition C outside of the region are used to form a superlattice structure having a thickness of each layer sufficiently thinner than a de Broglie wavelength. If the thickness of each layer is sufficiently thinner than a de Broglie wave, the wave function of carriers in each layer overlaps sufficiently and an average crystal property can be obtained.

Specifically, a layer having the composition B and a layer having the composition D are alternately grown to form a superlattice structure and obtain the same effective property of the crystal layer having the composition C. A de Broglie wave is generally about 100 A for group III-V compound semiconductor. If the thickness of each layer is set to about 20 A for example, a sufficient overlap between the wave functions can be obtained.

Figure 13B:
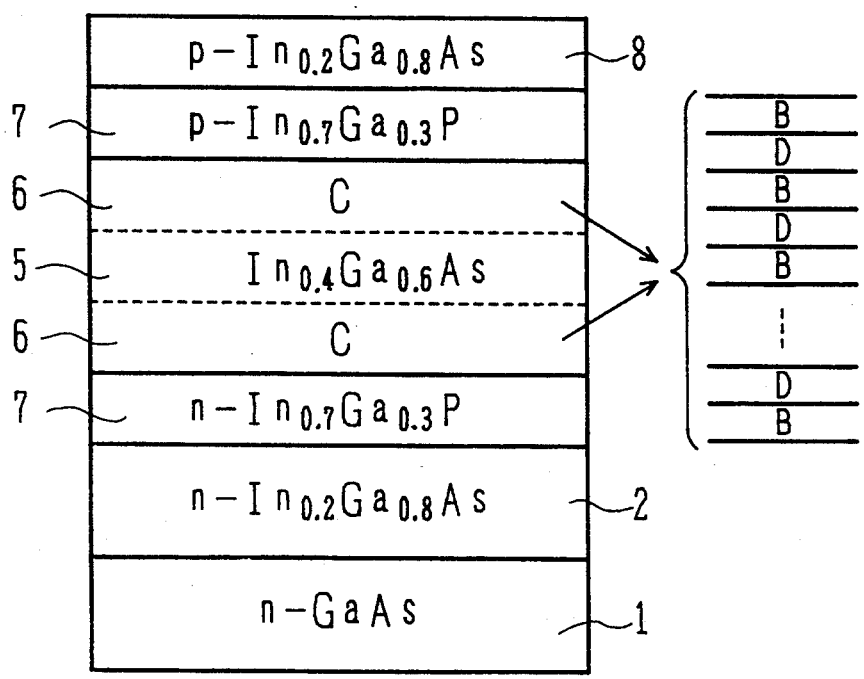

FIGS. 13B is a schematic cross sectional view showing the structure of a semiconductor laser using the superlattice structure described with FIG. 13A.

On an n-type GaAs substrate 1, an $In_{0.2}Ga_{0.8}As$ strain buffer layer 2 having an n-type impurity concentration of $1 \times 10^{18} cm^{-3}$ is grown to a sufficient thickness. On the strain buffer layer 2, an n-type $In_{0.7}Ga_{0.3}P$ clad layer 7 is epitaxially grown to a thickness of 1.0 μm having an n-type impurity concentration of $1 \times 10^{18} cm^{-3}$.

On the clad layer 7, an undoped guide layer 6 having a superlattice structure is grown. On the guide layer 6, an undoped active layer 5 of $In_{0.4}Ga_{0.6}As$ is grown. On the active layer 5, another undoped guide layer having a superlattice structure is grown. The guide layers 6 having the superlattice structure each have a structure alternately laminating an undoped $In_{0.25}Ga_{0.75}As_{0.90}P_{0.1}$ layer having a thickness of 20 A and an undoped $In_{0.65}Ga_{0.35}As_{0.1}P_{0.9}$ layer having a thickness of 20 A twenty times. The thickness of the active layer 5 is about 100 A.

On this SCH structure, a clad layer 7 of p-type $In_{0.7}Ga_{0.3}P$ is grown which has a p-type impurity concentration of $1 \times 10^{18} cm^{-3}$. On the clad layer, a p-type $In_{0.2}Ga_{0.8}As$ contact layer 8 having a p-type impurity concentration of $3 \times 10^{19} cm^{-3}$ is grown. The contact layer 8 and p-type clad layer 7 are etched to form a mesa structure having a width of 5 μm and a height of about 1 μm. The thickness of the clad layer under the mesa structure is about 0.15 μm.

By introducing a superlattice structure and setting the thickness of each layer sufficiently thin as compared to a de Broglie wave, it is possible to substantially realize a semiconductor layer having a composition in a non-miscible region.

In the above embodiments, an underlying crystalline layer having a lattice constant different from a substrate has been formed by using a substrate easily available and of good crystal property and by forming a strain buffer layer on the substrate.

The smaller relieving amount is preferable in order to reduce the number of generated dislocations. If the lattice constant of a subject composition is nearer to that of InP than that of GaAs, it is preferable to use an InP substrate.

Figure 14:
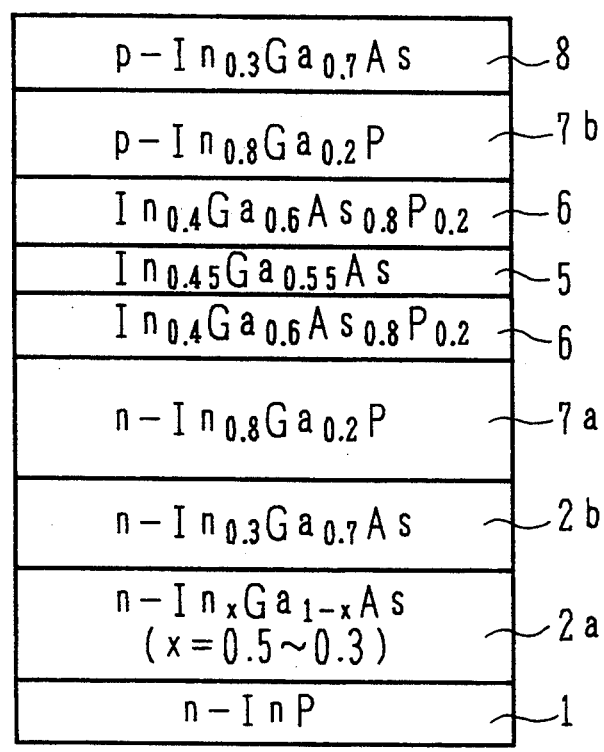
FIG. 14 is a schematic cross sectional view explaining a semiconductor laser according to another embodiment of the present invention.

FIGS. 14 is a schematic cross sectional view showing the structure of a semiconductor laser according to another embodiment of this invention. On an n-type InP substrate 1, an $In_xGa_{1-x}As$ gradient composition layer 2a is grown to a thickness of about 2.4 μm by linearly and gradually changing the composition x from 0.5 to 0.3. On the gradient composition layer 2a, a uniform composition layer 2b is grown to a thickness of 1 μm having a constant composition of $In_{0.3}Ga_{0.7}As$.

On the underlying crystalline layer formed as above, an n-type $In_{0.8}Ga_{0.2}P$ clad layer 7 is grown to a thickness of 1.0 μm, an undoped $In_{0.4}Ga_{0.6}As_{0.8}P_{0.2}$ guide layer 6 is grown to a thickness of about 1 μm, an undoped $In_{0.45}Ga_{0.55}As$ active layer 5 is grown to a thickness of 5 nm, and an undoped $In_{0.4}Ga_{0.6}As_{0.8}P_{0.2}$ guide layer 6 is grown to a thickness of 0.1 μm. The active layer 5 may be formed by a plurality of layers like the above embodiments.

On the guide layer 6, a p-type $In_{0.8}Ga_{0.2}P$ clad layer 7b is grown. On the clad layer 7b, a p-type $In_{0.3}Ga_{0.7}P$ contact layer 8 is grown to a thickness of 0.5 μm.

After the laminated structure is epitaxially grown in the above manner, a mesa etching is performed as described previously, and an electrode is formed.

With this structure, the lattice constant of the uniform composition layer 2b is offset by about 1.5% from that of the InP substrate 1. If a GaAs substrate is used in place of the InP substrate, the offset of the lattice constant is about 2%. The laser structure can be realized with less relieving amount by using an InP substrate rather than by using a GaAs substrate.

As the gradient composition layer of this embodiment, $In_xGa_{1-x}P$ may be used whose In composition x is continuously and linearly changed from 1.0 to 0.8. Further, $In_xGa_{1-x}As_{0.2}P_{0.8}$ may be used whose In composition x is continuously and linearly changed from 0.9 to 1.0. Still further, $In_{0.8}Ga_{0.2}As_yP_{1-y}$ may be used whose P composition x is continuously and linearly changed from 0.6 to 1.0. Part or the whole of GaAs may be replaced by Al. The composition change of the gradient composition layer is not limited to a continuous and linear change. For example, the composition may be changed stepwise to obtain a linear change as a whole. In the above embodiments, a ridge type semiconductor laser has been described by way of example. The above embodiment structure may be applied to other types of semiconductor lasers.

The present invention has been described in connection with the preferred embodiments. The invention is not limited only to the above embodiments. It is apparent to those skilled in the art that various modifications, substitutions, combinations and the like can be made without departing from the scope of the appended claims.

We claim:

1. A group III-V compound semiconductor laser for emitting light, said semiconductor laser including:
   a laser structure including an active layer for emitting light, guide layers sandwiching the active layer and having a band gap larger than the active layer, and clad layers embracing the guide layers and having a band gap larger than the guide layers, wherein the lattice constants of said guide layers and said clad layers are larger than a1 by 0.5% or more and smaller than a2 by 0.5% or more, where a1 represents the lattice constant of GaAs and a2 is the lattice constant of InP.

2. A group III-V compound semiconductor laser according to claim 1, said semiconductor laser emits light in a 1.3 μm band, and the lattice constants of said guide layer and clad layer are larger than a1 by 1.5% to 2.5%.

3. A group III-V compound semiconductor laser according to claim 1, said semiconductor laser emits light in a 1.55 μm band, and the lattice constants of said guide layer and clad layer are larger than a1 by 2.0% to 3.0%.

4. A group III-V compound semiconductor laser according to claim 1, further comprising an underlying crystalline layer having a lattice constant at the uppermost surface, said lattice constant being larger than a1 by 0.5% or more and smaller than a2 by 0.5% or more, wherein said laser structure is formed on said underlying crystalline layer.

5. A group III-V compound semiconductor laser according to claim 1, wherein said laser structure forms a cavity in which light reciprocally moves In the [1 1 0] direction.

6. A group III-V compound semiconductor laser according to claim 1, wherein said active layer of said laser structure has a lattice constant different from lattice constants of other layers.

7. A group III-V compound semiconductor laser according to claim 6, wherein the film thickness of said active layer of said laser structure is a film thickness of one mono-atomic layer or thicker and a critical film thickness or thinner.

8. A group III-V compound semiconductor laser according to claim 7, wherein said laser structure satisfies $d2 \times \{(a5-a6)/a6\}^2 < 9 \times 10^{-4}$ where d2 is a film thickness of said active layer, a5 is a lattice constant of said active layer at a no-strain state, and a6 is a lattice constant of said clad layer.

9. A group III-V compound semiconductor laser according to claim 6, wherein said active layer of said laser structure is made of InGaAs having a lattice constant larger than lattice constants of other layers.

10. A group III-V compound semiconductor laser according to claim 4, wherein said underlying crystalline layer includes a substrate and a group III-V compound semiconductor gradient composition layer whose composition is gradually changed from a composition lattice-matching said substrate.

11. A group III-V compound semiconductor laser according to claim 10, wherein said gradient composition layer satisfies $|(a4-a3)/d1| < 1.6 \times 10^{-5}$ where d1 is a film thickness of said gradient composition layer, a3 is a lattice constant of said gradient composition layer 2a at a no-strain state at the interface with said substrate, and a4 is a lattice constant of said gradient composition layer at a no-strain state at the uppermost surface thereof.

12. A group III-V compound semiconductor laser according to claim 11, wherein said gradient composition layer satisfies $|(a4-a3)/d1| < 1.2 \times 10^{-5}$.

13. A group III-V compound semiconductor laser according to claim 12, wherein said gradient composition layer satisfies $|(a4-a3)/d1| < 1.2 \times 10^{-5}$.

14. A group III-V compound semiconductor laser according to claim 10, wherein said underlying crystalline layer further includes a uniform composition layer grown on and lattice-matched with said gradient composition layer.

15. A group III-V compound semiconductor laser according to claim 14, wherein the lattice constant of said uniform composition layer is smaller by about 5% or larger by about 5% than the lattice constant of said gradient composition layer at a no-strain state at the uppermost surface thereof.

16. A group III-V compound semiconductor laser according to claim 10, wherein said gradient composition layer essentially consists of at least two kinds of aluminum, indium, and gallium and of at least one kind of arsenic and phosphorus.

17. A group III-V compound semiconductor laser according to claim 14, wherein said gradient composition layer essentially consists of at least two kinds of aluminum, indium, and gallium and of at least one kind of arsenic and phosphorus.

18. A group III-V compound semiconductor laser according to claim 10, wherein said gradient composition layer essentially consists of InGaAs.

19. A group III-V compound semiconductor laser according to claim 14, wherein said gradient composition layer essentially consists of InGaAs.

20. A group III-V compound semiconductor laser according to claim 10, wherein said substrate is made of GaAs or InP.

21. A group III-V compound semiconductor laser according to claim 14, wherein said substrate is made of GaAs or InP.

22. A group III-V compound semiconductor laser according to claim 14, wherein said substrate is made of GaAs, said gradient composition layer essentially consists of InGaAs and has a composition $In_xGa_{1-x}As$ at the uppermost surface thereof where x is 0.2 to 0.35.

23. A group III-V compound semiconductor laser according to claim 1 wherein at least one of said clad layers is made of a material having a band gap wider than InGaAs having the same lattice constant as said at least one of said clad layers.

24. A group III-V compound semiconductor laser according to claim 23, wherein said clad layer essentially consists of at least two kinds of aluminum, indium, and gallium and of at least one kind of arsenic and phosphorus.

25. A group III-V compound semiconductor laser according to claim 24, wherein said clad layer contains an aluminum component.

26. A group III-V compound semiconductor laser according to claim 24, wherein said clad layer essentially consists of AlGaInAsP having a band gap wider than InGaP having the same lattice constant as AlGaInAsP.

27. A group III-V compound semiconductor laser according to claim 1, wherein said clad layer on the side of said underlying crystalline layer is doped with group VI chalcogen elements at $5 \times 10^{18}$ to $3 \times 10^{19}$ cm$^{-3}$.

28. A group III-V compound semiconductor laser according to claim 27, wherein said group VI element includes Se.

29. A group III-V compound semiconductor laser according to claim 1, wherein said active layer includes two or more layers of the same composition disposed in said guide layers.

30. A group III-V compound semiconductor laser according to claim 1, wherein said guide layer has a composition represented by InGaAsP and has a P molar fraction of 0.3 or less as group V element.

31. A group III-V compound semiconductor laser according to claim 1, wherein said guide layer has a superlattice structure made of layers thinner than a de Broglie wavelegth.

32. A group III-V compound semiconductor laser according to claim 31, wherein said superlattice structure has a mixed crystal composition substantially in a non-miscible region.

33. A group III-V compound semiconductor laser according to claim 1, wherein said active layer has a superlattice structure having a layer alternately laminating an InAs layer and a GaAs layer.

34. A group III-V compound semiconductor laser according to claim 33, wherein said superlattice structure has a layer alternately laminating a 0.7 to 1 InAs layer and a 0.7 to 1 GaAs layer.

* * * * *